(12) United States Patent  
Robinson et al.

(10) Patent No.: US 7,210,581 B2
(45) Date of Patent: May 1, 2007

(54) APPARATUS FOR MAGNETICALLY SEPARATING INTEGRATED CIRCUIT DEVICES

(75) Inventors: Keith E. Robinson, Caldwell, ID (US); William L. Poulson, Boise, ID (US); Ionel Vulcan, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/346,215

(22) Filed: Jan. 16, 2003

(65) Prior Publication Data

US 2003/0127369 A1   Jul. 10, 2003

Related U.S. Application Data

(62) Division of application No. 09/904,365, filed on Jul. 12, 2001, now Pat. No. 6,634,504.

(51) Int. Cl.
  *B03C 1/00* (2006.01)
(52) U.S. Cl. ....................... 209/221; 209/231
(58) Field of Classification Search .............. 209/221, 209/231, 218, 225, 228, 245, 257; 198/846, 198/847
  See application file for complete search history.

(56) References Cited

U.S. PATENT DOCUMENTS

| 2,272,719 | A | * | 2/1942 | Maynard ................ 209/219 |
| 2,866,546 | A | * | 12/1958 | Roberts ..................... 96/3 |
| 2,992,733 | A | * | 7/1961 | Buus et al. ............. 209/219 |
| 3,474,904 | A | | 10/1969 | Casner et al. |
| 3,507,389 | A | | 4/1970 | Casner et al. |
| 3,581,890 | A | | 6/1971 | DeMuzio et al. |
| 3,623,603 | A | | 11/1971 | Casner et al. |
| 3,687,062 | A | | 8/1972 | Frank |
| 3,753,513 | A | | 8/1973 | Grenfell et al. |
| 3,809,239 | A | | 5/1974 | Barrett et al. |
| 3,863,764 | A | | 2/1975 | Myslinski et al. |
| 3,892,658 | A | | 7/1975 | Benowitz |
| 3,926,792 | A | | 12/1975 | Buford |
| 3,935,947 | A | | 2/1976 | Barrett |
| 4,031,004 | A | * | 6/1977 | Sommer et al. ............ 209/212 |
| 4,051,023 | A | | 9/1977 | Fogle et al. |

(Continued)

FOREIGN PATENT DOCUMENTS

DE   10031260   1/2001

(Continued)

Primary Examiner—Joseph Rodriguez
(74) Attorney, Agent, or Firm—TraskBritt (57) ABSTRACT

A method and apparatus of separating integrated circuit (IC) devices according to magnetic properties of the devices is disclosed. A plurality of IC devices are subjected to a magnetic field. The IC devices containing only nonferrous material are not responsive to the magnetic field and are thus gathered to a first collection site. The IC devices containing ferrous material adhere to a moving surface proximate the magnetic field and are transported to a second collection site. The sorted devices are then transported to separate locations for further processing. The apparatus used for separating the IC devices may include a conveyor having a magnetic drum and an antistatic belt which travels about the magnetic drum. The conveyor allows nonferrous IC devices to fall off the edge of the magnetic drum into the first collection site while transporting the ferrous IC devices to another location for collection.

18 Claims, 6 Drawing Sheets

U.S. PATENT DOCUMENTS

| | | | |
|---|---|---|---|
| 4,084,496 A | 4/1978 | Ehernberger et al. | |
| 4,113,142 A | 9/1978 | Ryzhov et al. | |
| 4,125,191 A | 11/1978 | Peace | |
| 4,225,047 A | 9/1980 | Grubman | |
| 4,356,905 A | 11/1982 | Large | |
| 4,373,435 A | 2/1983 | Grevich | |
| 4,436,619 A | 3/1984 | Petrov et al. | |
| 4,451,360 A * | 5/1984 | Salmi | 209/230 |
| 4,495,217 A * | 1/1985 | Schrum | 427/478 |
| 4,667,832 A | 5/1987 | Reinfeld | |
| 4,686,034 A | 8/1987 | Barrett | |
| 4,738,367 A | 4/1988 | Barrett | |
| 4,874,507 A * | 10/1989 | Whitlock | 209/11 |
| 4,882,043 A * | 11/1989 | Jung | 209/212 |
| 4,889,242 A | 12/1989 | Willberg et al. | |
| 4,929,342 A | 5/1990 | Johnston | |
| 5,092,986 A | 3/1992 | Feistner et al. | |
| 5,135,644 A * | 8/1992 | Susse | 209/225 |
| 5,167,184 A | 12/1992 | Rebecchi | |
| 5,230,869 A * | 7/1993 | Hettinger et al. | 422/144 |
| 5,291,980 A | 3/1994 | Abe | |
| 5,344,025 A | 9/1994 | Tyler et al. | |
| 5,394,973 A | 3/1995 | Emmart et al. | |
| 5,394,991 A | 3/1995 | Kumagai et al. | |
| 5,522,513 A * | 6/1996 | Howell | 209/636 |
| 5,584,395 A | 12/1996 | Homma | |
| 5,669,599 A | 9/1997 | Toh et al. | |
| 5,671,666 A | 9/1997 | Wenglar | |
| 5,722,542 A | 3/1998 | Davis | |
| 5,811,314 A | 9/1998 | Chen et al. | |
| 5,844,803 A | 12/1998 | Beffa | |
| 5,887,728 A * | 3/1999 | Muranaka et al. | 209/636 |
| 5,927,512 A | 7/1999 | Beffa | |
| 5,998,751 A | 12/1999 | Brunelle | |
| 6,041,942 A * | 3/2000 | Goolsby | 209/219 |
| 6,149,014 A * | 11/2000 | Mankosa et al. | 209/223.2 |
| 6,250,474 B1 * | 6/2001 | Howell | 209/219 |
| 6,253,924 B1 * | 7/2001 | Bleifuss et al. | 209/223.1 |
| 6,325,927 B1 * | 12/2001 | Green | 210/222 |
| 6,338,903 B1 | 1/2002 | Takigawa et al. | |
| 6,525,137 B1 * | 2/2003 | Alex et al. | 525/179 |
| 2002/0014440 A1 * | 2/2002 | Oder et al. | 209/8 |

FOREIGN PATENT DOCUMENTS

| | | |
|---|---|---|
| JP | 11151622 | 6/1999 |
| NL | 7407603 | 8/1974 |

* cited by examiner

|   |   |   |   |   |   |   |   |   |   |
|---|---|---|---|---|---|---|---|---|---|
| S | N | S | N | S | N | S | N | S | N |
| N | S | N | S | N | S | N | S | N | S |
| S | N | S | N | S | N | S | N | S | N |
| N | S | N | S | N | S | N | S | N | S |
| S | N | S | N | S | N | S | N | S | N |

*Fig. 3A*

|   |   |   |   |   |   |   |   |   |   |
|---|---|---|---|---|---|---|---|---|---|
| N | N | S | S | N | N | S | S | N | N |
| S | S | N | N | S | S | N | N | S | S |
| N | N | S | S | N | N | S | S | N | N |
| S | S | N | N | S | S | N | N | S | S |
| N | N | S | S | N | N | S | S | N | N |

APPARATUS FOR MAGNETICALLY SEPARATING INTEGRATED CIRCUIT DEVICES

CROSS-REFERENCE TO RELATED APPLICATION

This application is a divisional of application Ser. No. 09/904,365, filed Jul. 12, 2001, now U.S. Pat. No. 6,634,504, issued Oct. 21, 2003.

BACKGROUND OF THE INVENTION

1. Field of the Invention

The present invention relates generally to the sorting and classification of integrated circuit (IC) devices. More specifically, the present invention relates to the use of magnetism to separate and sort IC devices based upon the material content of the IC devices.

2. State of the Art

In the art of manufacturing IC devices (also known as semiconductor devices), inspection for quality is routine and often rigorous. Inspection of IC devices may include various techniques known in the art such as subjecting the devices to emission microscopy or X-ray analysis, connecting the IC devices to test circuits cycling the devices at temperature extremes and excessive power inputs and other methods well-known in the art. Such tests are employed to verify an IC device's functionality as well as its structural integrity. The process of inspecting IC devices is integral to any company's goal of efficiently producing devices that are stable, reliable and of sufficient longevity. Such tests are typically tailored to verify that a particular type of IC device will function properly in its intended capacity. In other words, testing standards are set for a specific IC device design, or lot of such devices, depending on an expectation of ultimate use. For example, memory chips designed for use in a typical home (personal) computer are inspected and tested to confirm operability and reliability for that particular purpose. IC devices of a different nature are tested to a different standard.

While the electronics industry has made great strides in producing high quality IC devices, defects are not uncommon. Because IC devices are produced in extremely high volumes, even the smallest defect occurrence rate will result in numerous IC devices being determined to be unsuitable for their intended use. As a result, IC devices are rejected and normally discarded. However, while an IC device may have been discarded based on a certain set of quality standards, the IC device may still have operational characteristics suitable for use in another application.

Discarded IC devices may be salvaged and retested using a second set of quality standards. The retesting is performed to determine suitability for a use independent of that for which the IC device was originally produced. Often, an IC device which fails a quality test for a specific use in terms of, for example, memory capacity or operation speed will satisfy the quality standards set forth for another defined use. For example, an IC device designed for use in a personal computer may fail to meet the quality standards set for such a use while still meeting the standards required for use in a household appliance. Thus, the IC device is not entirely unusable. Rather, it is simply redesignated as to the end use of the device. Redesignation of IC devices based on satisfaction of independent quality standards allows for greater efficiency of production. While the overall number or percentage of IC devices having defects as defined for a specified use is not reduced, the economic loss concerning those defects may be substantially ameliorated upon a proper redesignation or reclassification for a different use.

Prior to any retesting procedures, it may be necessary to properly sort rejected IC devices, as such rejected IC devices may be collected in massive quantities including a number of different types of IC devices with little or no effort made in classifying such devices at the time of testing and rejection. Therefore, a segregating and sorting operation is required. Such an operation is conventionally done by hand, sorting according to predefined criteria. For example, one sort operation may be directed to dividing out devices which are classifiable as "flip chips" from those which are not. Likewise, devices having certain types of lead frames may be separated from other in the lot. Regardless of the base criteria defined for preliminary sorting operations, the sorting is usually done by hand. Sorting by hand requires some training of the individuals performing the sort and tends to be rather inefficient, tedious and time consuming.

In a typical scenario, a fifty-five gallon drum or other large container of rejected IC devices is delivered for sorting and retesting. Perhaps fifty percent, or less, of the devices are of a desired preliminary classification suitable for potential testing and use. One or more individuals will laboriously sift through the entire lot, visually inspect each of the IC devices and determine whether they satisfy a preliminary sort criteria. Sorting by hand is, therefore, a rather time intensive task and is susceptible to human error.

In view of the shortcomings in the state of the art of sorting large quantities of such IC devices, providing an apparatus and method for an automated preliminary sorting of large quantities of IC devices would be advantageous based on a defined device characteristic. Such an apparatus or method should, among other things, be easy to implement, reduce the test time as well as the required amount of human effort, be accurate, and increase the overall efficiency of the retesting process.

BRIEF SUMMARY OF THE INVENTION

In accordance with one aspect of the present invention, a method is provided for sorting a plurality of IC devices, such as memory chips or other packaged semiconductor devices. Based on a preliminary sorting criteria of lead frame metallurgical characteristics, the method includes subjecting the plurality of IC devices to a magnetic field. Ferrous metal containing IC devices, such as those manufactured with a ferrous alloy lead frame, are attracted by the magnetic field, while nonferrous IC devices do not respond to the pressure of the magnetic field. The nonferrous IC devices may thus be isolated for removal and gathered or binned to a first collection category. The remaining IC devices responsive to the magnetic field are ferrous alloy containing IC devices which may then be gathered or binned to a second collection category.

The inventive method may include transporting the IC devices through the magnetic field by means of a conveyor. While various sources are contemplated for providing the magnetic field, the method preferably includes providing a conveyor with an end pulley, or roller, having permanent magnets installed on an interior surface of a stainless steel shell. The magnetic field may advantageously be assisted by gravity in sorting ferrous and nonferrous IC devices. For example, the conveyor may be configured and oriented to carry the IC devices through a magnetic field subjecting the IC devices to be sorted to both a magnetic field as well as a conflicting gravitational field contemporaneously. The nonferrous IC devices thus respond to the gravitational field but not the magnetic field to facilitate collecting them in a common location, while the ferrous IC devices are carried to another collection location.

In accordance with another aspect of the invention, an apparatus for sorting IC devices based on ferrous metal content is provided. The apparatus includes a roller having a stainless steel shell and housing a plurality of permanent magnets. A circuitous belt partially circumscribes the roller and is adapted to convey a plurality of IC devices to an area proximate the roller's surface. The belt is preferably formed or coated with an antistatic (ESD) material so as to not damage the IC devices or further impair their operation and performance. The apparatus may include a grounding mechanism to assist in preventing electrostatic discharge between the belt and the IC devices.

Various additional features may be incorporated into the apparatus such as a feeding mechanism for distributing the IC devices onto the conveyor at a predetermined rate. Other features might include, for example, individual collection bins, guides for maintaining the chips on the conveyor when not in a sorting zone, tensioning and tracking devices for proper operation and maintenance of the belt, secondary conveyors for transporting the sorted IC devices to other sites remote from the conveyor sites for additional processing, additional magnetic zones, or specific magnetic pole arrangements within the magnetic drum.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
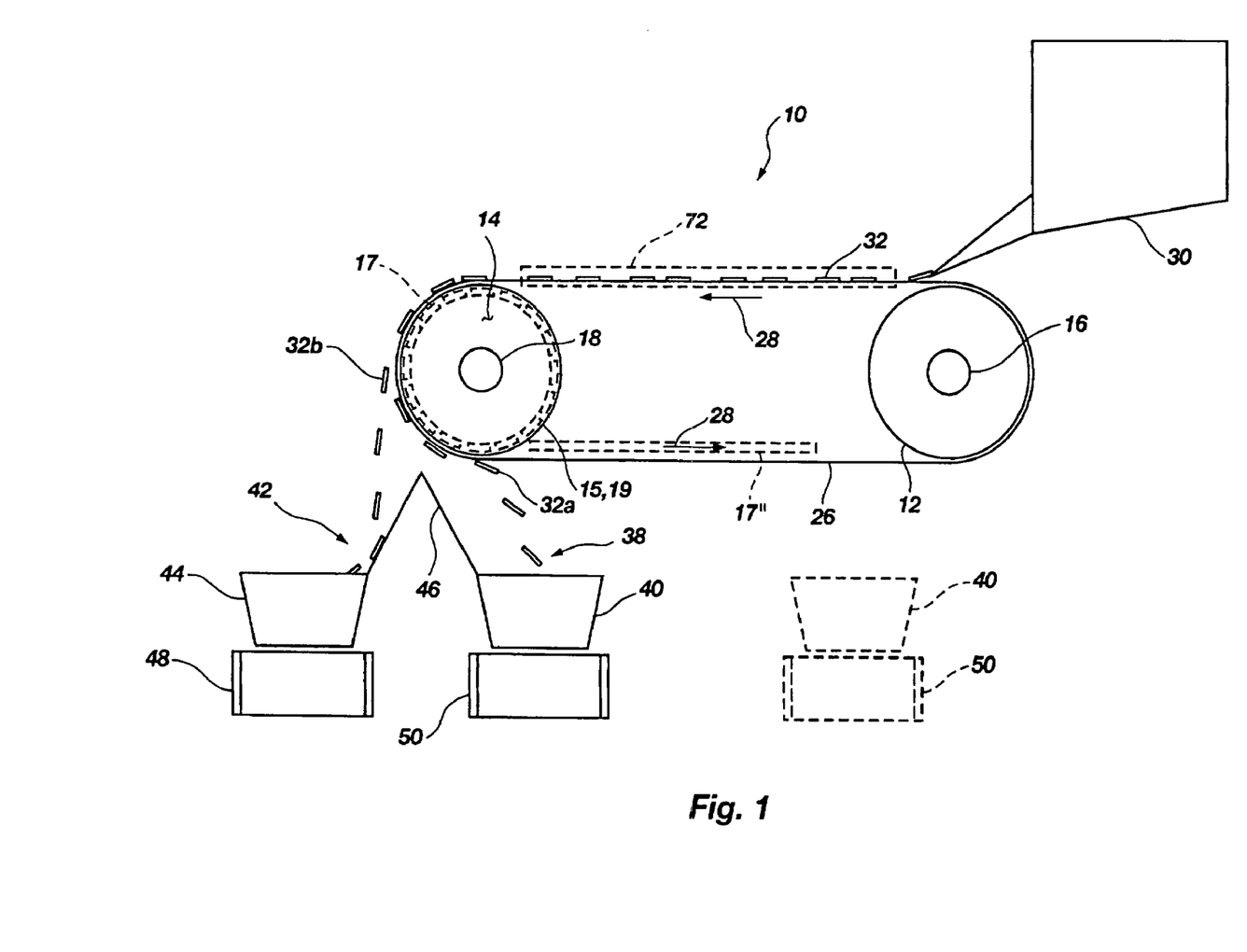
FIG. 1 is an elevational view of one exemplary apparatus according to an embodiment of the present invention.
Figure 2:
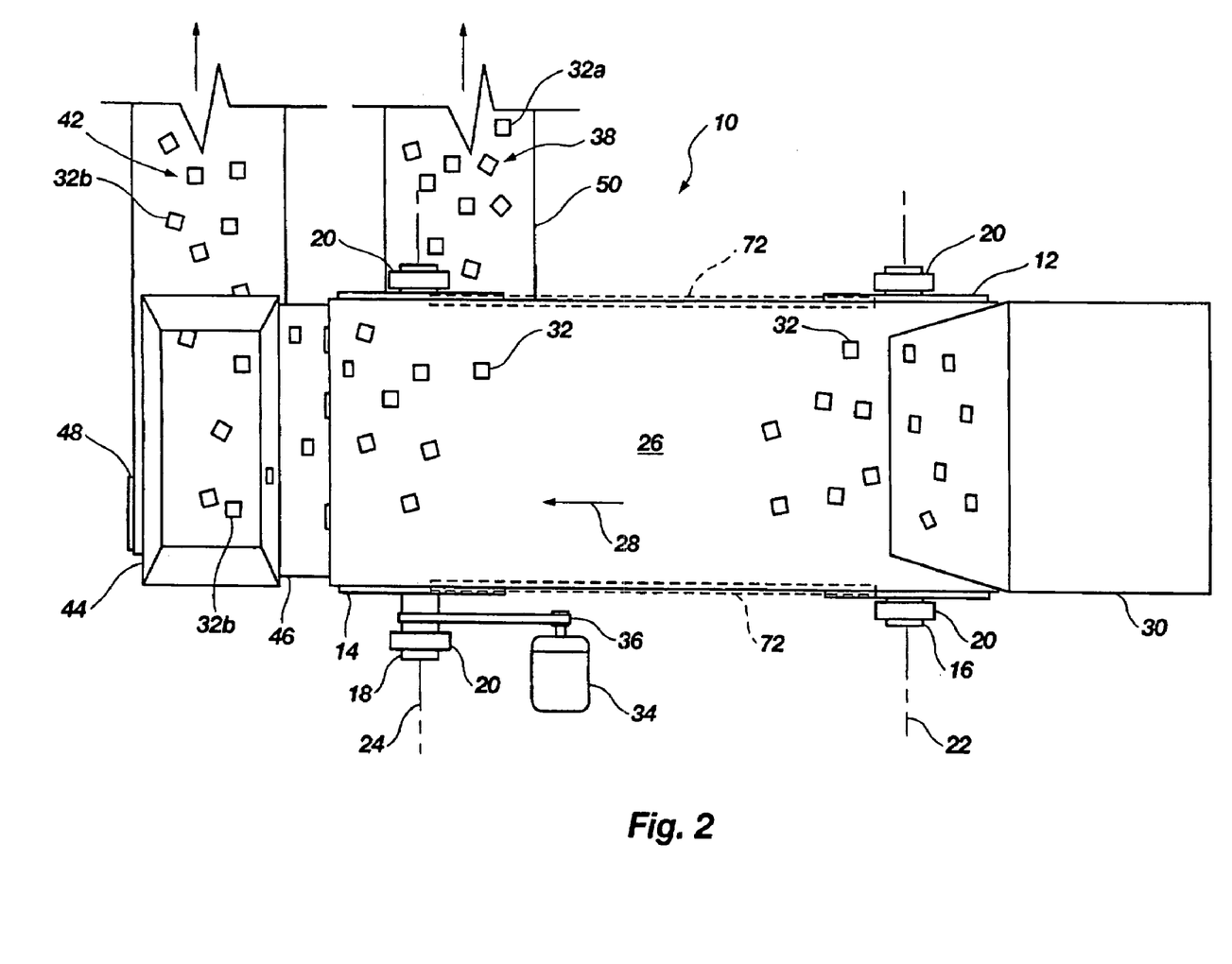
FIG. 2 is a plan view of the apparatus depicted in FIG. 1.

Referring to FIGS. 1 and 2, a magnetic separating conveyor 10 is shown. The conveyor includes a first roller or end pulley 12 and a second roller or end pulley 14. Each roller 12 and 14 is mounted to a shaft 16 and 18 respectively, the shafts 16 and 18 each being supported by a bearing assembly 20 not in FIG. 1. Each shaft 16 and 18, and thus each roller 12 and 14 is respectively rotatable about an axis 22 and 24. The shafts 16 and 18 may be formed as solid continuous shafts traversing through the width of the rollers, or they may be formed as stub shafts axially aligned at each end of the roller and secured to an external side surface thereof.

A continuous transport belt 26 is positioned such that it partially circumscribes each roller or end pulley 12 and 14 and extends longitudinally between end pulley 12 and 14.

The transport belt 26 travels in a generally circuitous path as indicated by directional arrows 28. Adjacent the first roller 12 is a feeding hopper 30 for distributing a plurality of IC devices 32 onto the transport belt 26 of the conveyor 10. The feeding hopper 30 may include various devices or features, such as, for example, a vibratory mechanism (not shown) to assist in settling the IC devices 32 out of the feeding hopper 30 in a random spreading pattern. The feeding hopper 30 may utilize other mechanisms for motivating the IC devices 32 from feeding hopper 30 to the transport belt 26 of the conveyor 10, such as a pneumatic feed, a paddle-type feed, or a screw feed. The feeding hopper 30 is preferably adjustable with regard to the rate at which the IC devices 32 are transferred thereby to the transport belt 26 of the conveyor 10 and photocell, proximity or other sensors adjacent the top surface of continuous transport belt 26 may be employed to detect the presence or absence of IC devices thereon to initiate or cease feeding.

It is noted that a frame or other foundation structure is required for mounting and fixing the location of the various components of conveyor 10 described herein. However, for sake of clarity and understanding no such frame is depicted in the drawings, and such a structure for providing adequate support is considered to be within the ability of one of ordinary skill in the art. Likewise, the bearing assembly 20 and an exemplary drive discussed further below are only shown in FIG. 2 for similar reasons.

A belt drive in the form of an electric motor 34 is engaged with the shaft 18 of the second roller 14 via a drive belt 36, which may comprise, for example, a toothed or cogged belt to cooperatively engage the drive shaft of electric motor 34 and shaft 18 provided with mating teething. The electric motor 34 drives the shaft 18 of the roller 14 causing the roller to rotate in a counterclockwise direction as viewed in FIG. 1. Proper tension in the transport belt 26 results in friction between the transport belt 26 and the second roller 14. Rotation of the second roller 14 causes the transport belt 26 to move in the direction as indicated by arrows 28 carrying with it the IC devices 32 placed on the transport belt 26 by the feeding hopper 30.

Figure 3A:
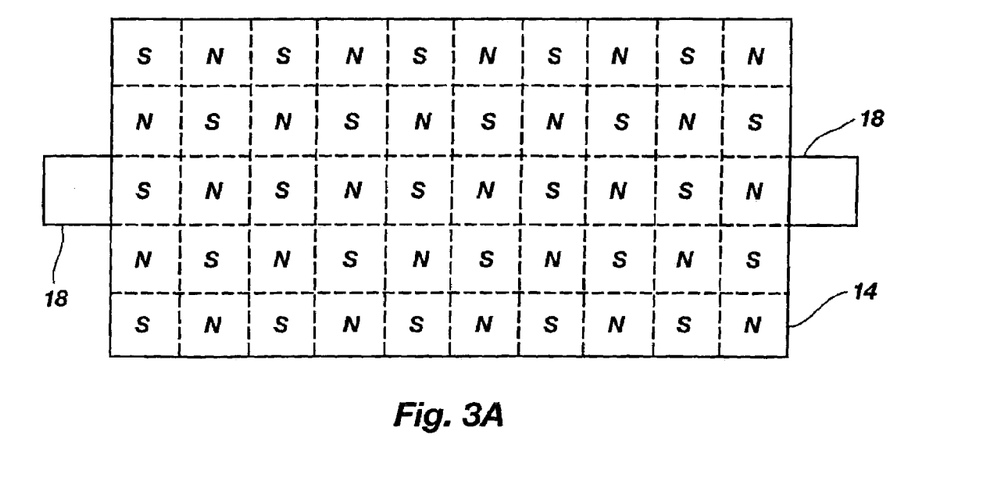
FIG. 3A is a schematic of one embodiment of a magnetized drum according to the present invention.

The second roller 14 is fabricated with a cylindrical stainless steel shell 15 containing a plurality of permanent magnets 17 in the interior thereof. The magnets 17 are arranged within the shell 15 to create a predetermined magnetic field through which the IC devices 32 on transport belt 26 will pass. The second roller 14 may thus also be referred to as the magnetic roller 14, or the magnetic drum 14. FIG. 3A depicts one arrangement of the magnetic poles within the magnetic drum 14 according to one embodiment of the present invention. As shown in FIG. 3A, the magnetic poles are arranged across the face of the magnetic drum 14, as well as around the circumference of the magnetic drum 14, in an alternating pattern of north (N) poles and south (S) poles. This arrangement promotes the development of numerous magnetic flux lines above the exterior surface 19 (FIG. 1) of magnetic drum 14. The resulting magnetic field is efficient in attracting all ferrous metal-containing objects which come within proximity of the surface of the magnetic drum 14 as transport belt 26 passes thereover.

Figure 3B:
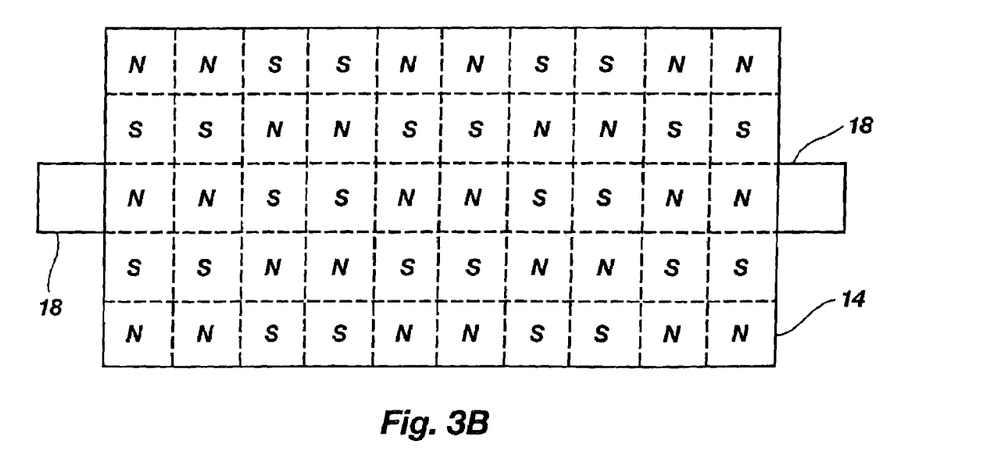
FIG. 3B is a schematic of another embodiment of a magnetized drum according to the present invention.

FIG. 3B shows an alternative arrangement for the magnetic poles within the magnetic drum 14. In the embodiment depicted in FIG. 3B, poles of like orientation are arranged in pairs. Thus, two North (N) poles are positioned adjacent to each other and likewise two South (S) poles are positioned adjacent each other. The pole pairs (N—N or S—S) are then arranged in an alternating pattern across the face of the drum while different single poles alternate (N-S-N-S) around the circumference of the magnetic drum 14. Alternatively, the like oriented pole pairs could be positioned to alternate around the circumference of the drum. Additionally, it is contemplated that all N-poles (or all S-poles) could be outwardly facing. These arrangements may likewise be sufficient in magnetically attracting ferrous objects to the drum as is required by the process described below.

It is noted that the magnetic field produced by the magnetic drum 14 is comprised of multiple magnetic flux lines which penetrate the overlying drum shell 15 as well as the thickness of transport belt 26. The properties of the transport belt 26 become an important consideration in the design of the conveyor 10. The transport belt 26 should not substantially interfere with the magnetic flux lines produced by the magnetic drum 14. At the same time, the transport belt 26 must satisfy certain tensile strength requirements and preferably be constructed from antistatic material, as it is important that the transport belt 26 be able to carry the IC devices 32 without significant concern of electrostatic discharge. As noted previously, electrostatic discharge may impair the subsequent operation and performance of the IC device 32. The transport belt 26 may be constructed of stainless steel to perform as required. To assist with the prevention of electrostatic discharge, the belt may be thinly coated with an antistatic material such as, for example, polyester, PVC, silicon, or polyethylene. Alternatively a grounding mechanism may be incorporated into the conveyor 10.

Returning to FIGS. 1 and 2, after the IC devices 32 are dispensed, such as from the feeding hopper 30 to the transport belt 26, the transport belt 26 carries the IC devices 32 until they reach the magnetic drum 14. As the transport belt 26 travels around the magnetic drum 14, the IC devices 32 are subject to a sorting process. Among the plurality of IC devices 32 placed on the transport belt 26, some are manufactured with lead frames which contain a ferrous material such as, for example, alloy 42 (ASTM F30). Other IC devices 32 include lead frames made from nonferrous material such as, for example, copper, aluminum or alloys thereof. The ferrous alloy containing IC devices 32*a* respond to the magnetic field created by the magnetic drum 14 by adhering to the surface of transport belt 26 as the transport belt 26 rotates from the upper side of the conveyor 10 to the underside of the conveyor 10. The ferrous IC devices 32*a* are carried along the underside of the conveyor 10 away from the magnetic field of the drum 14 until the force of gravity is stronger than the magnetic field-induced force between the IC device 32*a* and magnetic drum 14. When this occurs, each ferrous IC device 32*a* drops from the transport belt 26 and is collected in a first collection bin 40.

The nonferrous IC devices 32*b* are not responsive to the magnetic field imposed by the magnetic drum 14. Thus, as the nonferrous IC devices 32*b* rotate on transport belt 26 around the magnetic drum 14 from the upper side of the conveyor 10, gravity causes them to fall off of the transport belt 26 into a second collection bin 44. A barrier 46 or a divider is positioned between the first collection bin 40 and second collection bin 44 to help isolate the two collecting sites from one another and guide the IC devices 32*a* and 32*b* to their respective collection bins 40 and 44. The apparatus embodiment depicted in FIGS. 1 and 2 further includes secondary conveying systems 48 and 50, which is illustrated as belt-type conveyors oriented transverse to the drawing sheet. The secondary conveying systems 48 and 50 may be used to transport the sorted IC devices 42 and 38, respectively, for further processing which may include additional sorting and testing.

Figure 4:
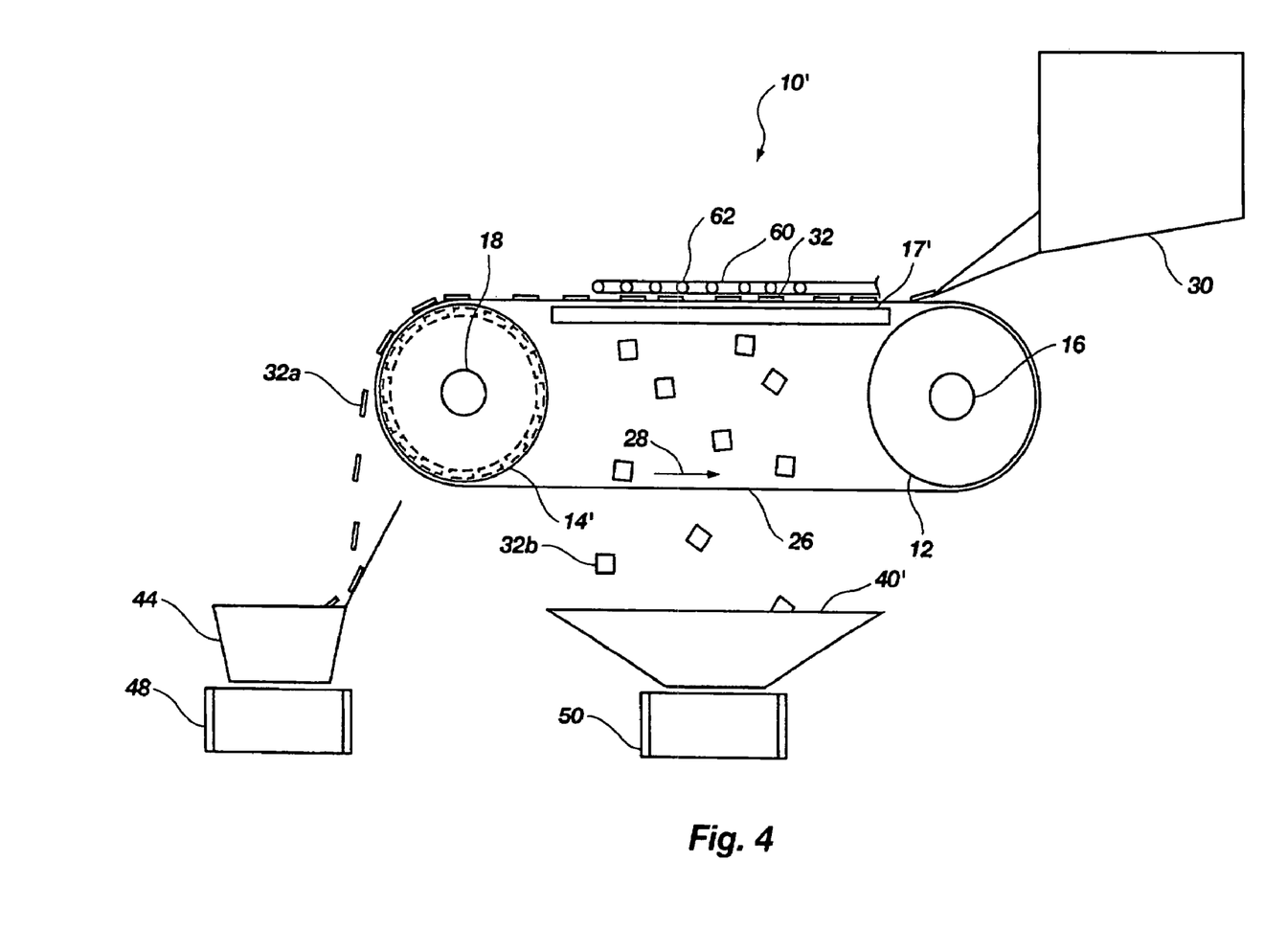
FIG. 4 is an elevational view of an exemplary apparatus according to another embodiment of the present invention.
Figure 5:
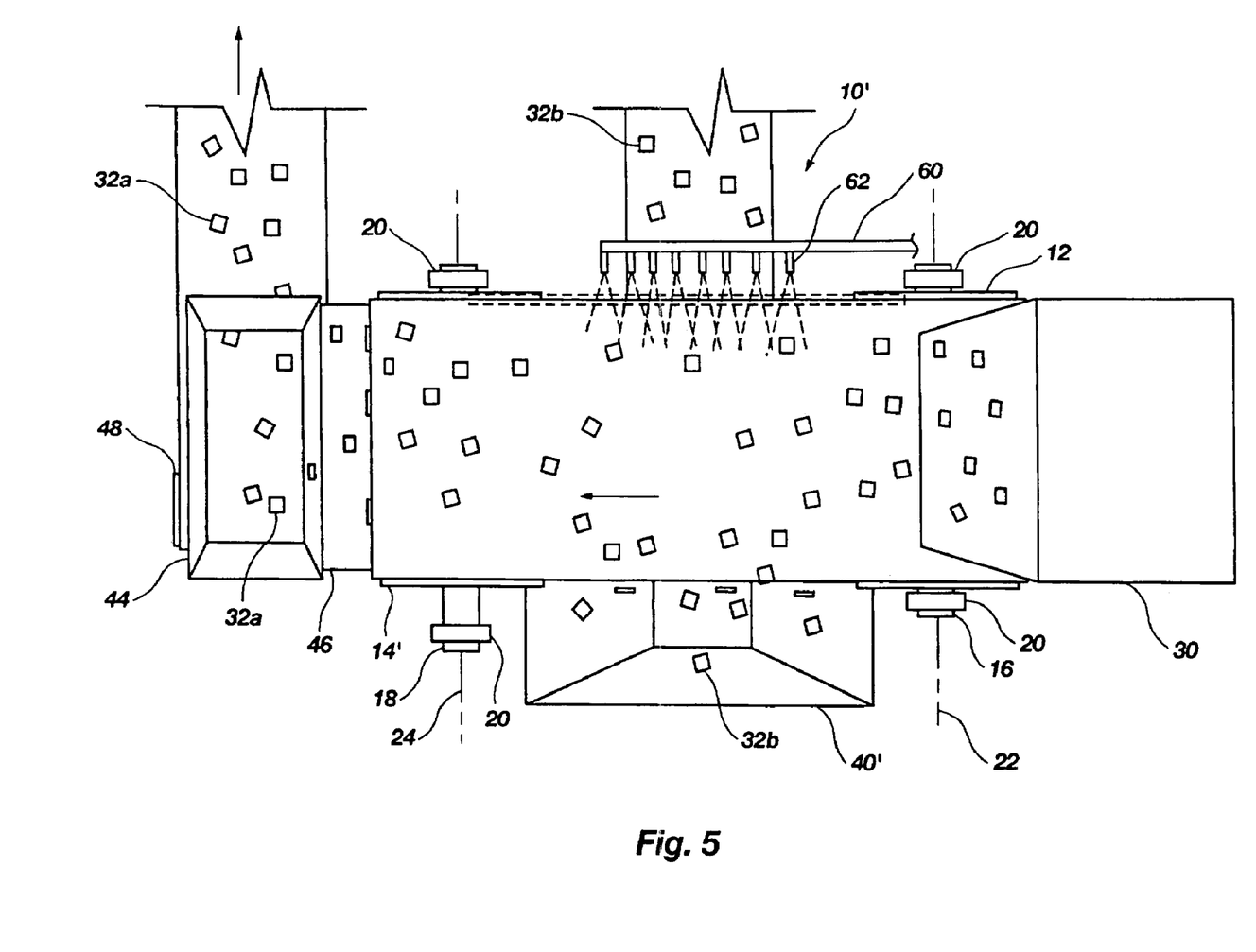
FIG. 5 is a plan view of the apparatus depicted in FIG. 4.

Referring to FIGS. 4 and 5, an alternative embodiment of a magnetic separating conveyor 10' is shown. The magnetic separating conveyor 10' is similar to that previously described, including rollers 14' and 16 and a transport belt 26. It is noted that the second roller 14' need not include a plurality of magnets therein, and may, therefore, need not be constructed of stainless steel. Rather, a magnetic field is provided by placing one or more permanent magnets 17' beneath the transport belt 26 between the first and second rollers 14' and 16. A header 60 located to one side of the transport belt 26 may supply pressurized air to a plurality of jet nozzles 62 such that pressurized air sweeps across the upper surface of the transport belt 26 as IC devices 32 pass thereby. The magnet or magnets 17' create a magnetic field to attract the ferrous IC devices 32*a* while the nonferrous IC devices 32*b* are blown off the side of the transport belt 26 by the force of the air created by the jet nozzles 62. In this case the nonferrous IC devices 32*b* are collected in the first collection bin 40' while ferrous IC devices 32*a* continue with the transport belt 26 until the rotate around the second roller 14' and drop into the second collection bin 44.

Figure 6:
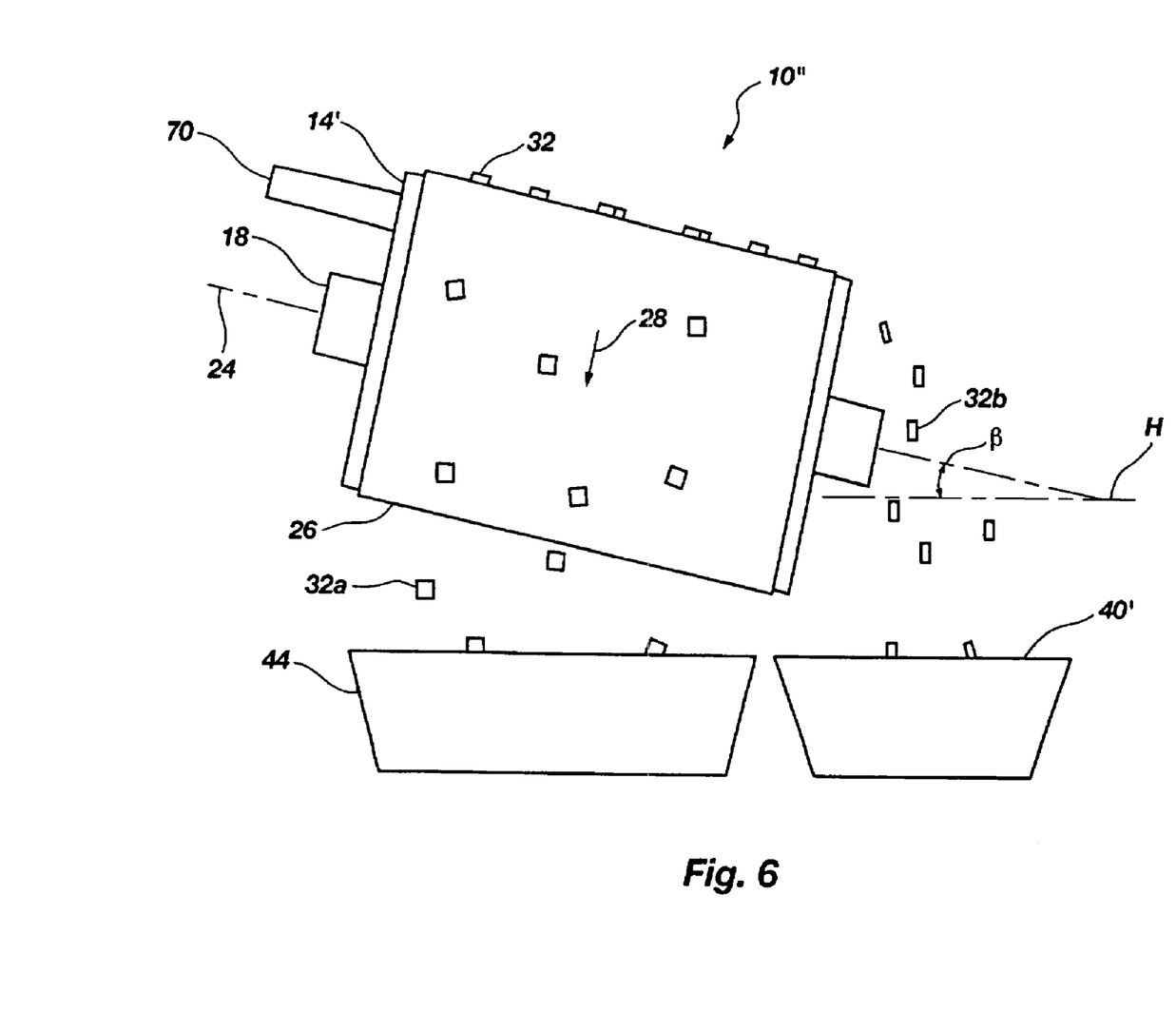
FIG. 6 is an elevational view from one end of another embodiment of an apparatus according to the present invention.

FIG. 6 shows an end view of another embodiment of the magnetic separating conveyor 10" wherein at least one of the rollers, in this case the second roller 14', is set an angle $\beta$ relative to the horizontal plane H. It is noted that the second roller 14' is similar to that used in the embodiment of FIGS. 4 and 5 and thus does not require a plurality of magnets to be placed therein.

One or more magnets are located beneath the transport belt 26 along its upper path similar to the embodiment shown in FIG. 4. A vibrating mechanism 70 may likewise be utilized to cause the transport belt to vibrate along its upper path. In operation, the ferrous IC devices 32*a* will be attracted to the magnetic field and remain on the transport belt 26 while the vibrating mechanism 70 will urge any nonferrous IC devices 32*b* to slide down the inclined portion of the transport belt 26 and into a first collection bin 40'. The ferrous containing devices 32*a* will continue with the transport belt 26 and rotate off the second roller 14' and drop into a second collection bin 44.

It is noted that the magnetic separating conveyor 10" may configure both rollers 12 and 14' at an angle $\beta$ from the horizontal plane H, or alternatively keep one roller 12 or 14' parallel with the horizontal plane H while the other is placed at an angle $\beta$. In the case where only one roller 12 or 14' is placed at an angle $\beta$ the transport belt 26 will have a slight twist in it as it travels from the first roller 12 to the second roller 14'.

The above-described apparatus thus presents a process for sorting IC devices according to their ferrous properties. While individual portions of the process have been discussed in conjunction with corresponding features of the apparatus and system, the process is summarized below for enhanced clarity and understanding. While the process is not to be limited to performance with the above described apparatus, it is summarized with reference to the above disclosed embodiment of the apparatus, and particularly with respect to the embodiment shown in FIGS. 1 and 2.

The process may begin by placing a plurality of IC devices 32 in the feeding hopper 30. The IC devices 32 typically include packaged IC devices which have failed a particular regimen of testing but which still have value which may be realized through redesignation of use. The feeding hopper 30 distributes the IC devices 32 onto the transport belt 26 at a rate, which may be predefined or responsive to feedback from sensors placed adjacent the top surface of transport belt 26, as previously noted. The transport belt 26 conveys the IC devices 32 into a magnetic field which, in the above described embodiment, is provided by a rotating magnetic drum 14 about which the transport belt 26 travels. The magnetic field serves to sort ferrous IC devices 32a from nonferrous IC devices 32b. The nonferrous IC devices 32b do not respond to the magnetic field above the surface of the magnetic drum 14 and fall under the force of gravity after passing over magnetic drum 14 to a location wherein they are no longer held by friction against transport belt 26 to be gathered to a collection site such as collection bin 44. Ferrous IC devices 32a adhere to the transport belt 26 by virtue of the magnetic field above the magnetic drum 14 and are thus transported by the transport belt 26 until they are beyond the range of the magnetic field as the transport belt 26 moves away from magnetic drum 14. Once beyond the magnetic field, the ferrous IC devices 32a fall under gravity to be gathered to another collection site such as collection bin 40. The ferrous IC devices 32a and the nonferrous devices 32b may then be transported for additional processing according to desired use of each class of device. The process is efficient in sorting IC devices based on the ferrous content or lack of same of each IC device while not damaging or impairing subsequent performance of the individual IC devices 32.

While the invention is susceptible to various modifications and alternative implementations, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

For example, guide rails 72 (FIGS. 1 and 2) or a chute may be installed along the sides of transport belt 26 to maintain the IC devices 32 on the transport belt 26. Such guide elements are preferably formed of stainless steel to minimize the effect of these components on the magnetic field. Additionally, the magnetic field may be extended to be present rotationally after the magnetic drum 14 to assist in the separating process and for further convenience in separating the collection bins 40 and 44. Belt tensioning and tracking devices may be added for proper maintenance and operation of the transport belt 26. Variable speed drives may be implemented for belt speed rate control. Such devices provide greater operational control and help to prevent undue wear to the belt and system.

It is also noted that numerous belt drives are compatible with the above described conveyor 10. The conveyor 10 may be driven by chain, gear, or direct drive from electric motor 34. Similarly, the belt drive may be powered by hydraulics rather than electric motor 34. Also, the belt drive may be coupled to a roller other than a magnetic drum including, if desired, an independent drive roller.

It is further noted that the method of sorting IC devices according to magnetic properties may be conducted using other systems or apparatus and is not limited to sorting with a magnetic separating conveyor.

What is claimed is:

1. A sorting system comprising:
   a supply of IC devices including at least one ferrous IC device and at least one nonferrous IC device;
   a roller having a plurality of permanent magnets; a circuitous antistatic belt having a predefined path, the belt at least partially circumscribing the roller wherein the belt conveys IC devices from the supply including the at least one ferrous IC device and the at least one nonferrous IC device to a location adjacent the roller;
   a first collection zone for receipt of the at least one nonferrous IC device; and
   a second collection zone for receipt of the ferrous IC devices.

2. The system claim 1, further comprising a feeder proximate a portion of the belt wherein the feeder distributes a plurality of IC devices onto the belt at a specified rate.

3. The system of claim 2, wherein the feeder includes a vibrating mechanism for motivating the plurality of IC devices from the feeder to the belt and wherein the vibrating mechanism distributes the plurality of IC devices across a width of the belt.

4. The system of claim 1, wherein the plurality of permanent magnets is arranged in an alternating pattern of north and south magnetic poles in the axial direction across the face of the roller.

5. The system of claim 1, wherein the plurality of permanent magnets is arranged in a plurality of common pole pairs.

6. The system of claim 5, wherein the plurality of common pole pairs is arranged in an alternating pattern of north and south pairs in the axial direction across the face of the roller.

7. The system of claim 1, wherein the belt comprises stainless steel.

8. The system of claim 1, wherein the belt comprises at least one of polyester, PVC, silicon and polyethylene.

9. The system of claim 1, wherein the first collection zone is located for receipt of the at least one nonferrous IC device as it rotates off of the roller.

10. The system of claim 9, wherein the second collection zone is located for receipt of the at least one ferrous IC device after is transferred from an upper side of the predefined path of the circuitous antistatic belt to an underside of the predefined path of the circuitous antistatic belt.

11. The system of claim 10, further comprising a secondary conveyor adjacent the first collection zone.

12. The system of claim 11, wherein the secondary conveyor includes an antistatic belt for transporting the at least one nonferrous IC device.

13. The system of claim 10, further comprising a secondary conveyor adjacent the second collection zone.

14. The system of claim 13, wherein the secondary conveyor includes an antistatic belt for transporting the at least one ferrous IC device.

15. The system of claim 1, wherein the roller includes an outer shell formed of stainless steel.

16. The system of claim 1, wherein the plurality of permanent magnets are arranged to exhibit at least one change of magnetic poles in an axial direction across a face of the roller and at least one change in magnetic poles in a circumferential direction about a circumferential periphery of the roller.

17. The system of claim 11, further comprising an additional secondary conveyor adjacent the second collection zone.

18. The system of claim 17, wherein the additional secondary conveyor includes an antistatic belt for transporting the at least one ferrous IC device.

* * * * *